(12) United States Patent
Lind et al.

(10) Patent No.: US 7,737,035 B1
(45) Date of Patent: Jun. 15, 2010

(54) DUAL SEAL DEPOSITION PROCESS CHAMBER AND PROCESS

(75) Inventors: Gary Lind, Paso Robles, CA (US); Colin F. Smith, Half Moon Bay, CA (US); William Johanson, Gilroy, CA (US); Thomas M. Pratt, San Jose, CA (US); John Mazzocco, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 810 days.

(21) Appl. No.: 11/542,723

(22) Filed: Oct. 3, 2006

Related U.S. Application Data

(60) Provisional application No. 60/788,262, filed on Mar. 31, 2006.

(51) Int. Cl.
  *H01L 21/44* (2006.01)
  *C23C 16/00* (2006.01)
(52) U.S. Cl. ............. 438/680; 29/25.01; 118/715; 118/723 VE
(58) Field of Classification Search ............. 29/25.01; 438/680; 118/723 VE, 715
  See application file for complete search history.

(56) References Cited

U.S. PATENT DOCUMENTS

| | | | |
|---|---|---|---|
| 5,855,465 | A | 1/1999 | Boitnott et al. |
| 6,013,155 | A | 1/2000 | McMillan et al. |
| 6,030,881 | A | 2/2000 | Papasouliotis et al. |
| 6,316,063 | B1 | 11/2001 | Andideh et al. |
| 6,335,261 | B1 | 1/2002 | Natzle et al. |
| 6,352,943 | B2 | 3/2002 | Maeda et al. |
| 6,352,953 | B1 | 3/2002 | Seki et al. |
| 6,503,330 | B1 | 1/2003 | Sneh et al. |
| 6,511,539 | B1 | 1/2003 | Raaijmakers |
| 6,534,395 | B2 | 3/2003 | Werkhoven et al. |
| 6,534,802 | B1 | 3/2003 | Schuegraf |
| 6,540,838 | B2 | 4/2003 | Sneh et al. |
| 6,551,339 | B2 | 4/2003 | Gavronsky |
| 6,551,399 | B1 | 4/2003 | Sneh et al. |

(Continued)

FOREIGN PATENT DOCUMENTS

JP    5-308071 A    11/1993

(Continued)

OTHER PUBLICATIONS

"Atomic Layer Deposition of Metal Oxide Thin Films," A thesis presented by Dennis Michael Hausmann, Harvard University, 186 pages, Jul. 2002.

(Continued)

*Primary Examiner*—Michelle Estrada
(74) *Attorney, Agent, or Firm*—Weaver Austin Villeneuve & Sampson LLP

(57) ABSTRACT

An apparatus and method for sealing and unsealing a chemical deposition apparatus in a chemical deposition process chamber includes a microvolume that has dual sealing elements at its periphery. One seal, the outer seal, is used to seal the inside of the microvolume from the main process chamber. The second (inner) seal is used to seal the inside of the microvolume from a vacuum source. The apparatus and process of the present invention has several advantages for enhanced chamber performance.

33 Claims, 13 Drawing Sheets

U.S. PATENT DOCUMENTS

| | | | |
|---|---|---|---|
| 6,586,349 | B1 | 7/2003 | Jeon et al. |
| 6,835,417 | B2 | 12/2004 | Saenger et al. |
| 6,867,152 | B1 | 3/2005 | Hausmann et al. |
| 6,867,309 | B2 | 3/2005 | Chen et al. |
| 6,884,738 | B2 | 4/2005 | Asai et al. |
| 7,097,878 | B1 | 8/2006 | Rulkens et al. |
| 7,109,129 | B1 | 9/2006 | Papasouliotis |
| 7,129,189 | B1 | 10/2006 | Hausmann et al. |
| 7,135,418 | B1 | 11/2006 | Papasouliotis |
| 7,148,155 | B1 | 12/2006 | Tarafdar et al. |
| 7,235,459 | B2 | 6/2007 | Sandhu |
| 2002/0059904 | A1 | 5/2002 | Doppelhammer |
| 2002/0100418 | A1 | 8/2002 | Sandhu et al. |
| 2002/0123230 | A1* | 9/2002 | Hubacek ............... 438/712 |
| 2002/0127436 | A1* | 9/2002 | Shibamoto et al. ..... 428/694 TS |
| 2002/0157960 | A1* | 10/2002 | Dordi et al. ............ 205/143 |
| 2002/0195683 | A1 | 12/2002 | Kim et al. |
| 2003/0015764 | A1 | 1/2003 | Raaijmakers et al. |
| 2003/0121537 | A1 | 7/2003 | Dunn |
| 2003/0134038 | A1 | 7/2003 | Paranjpe |
| 2004/0004247 | A1 | 1/2004 | Forbes et al. |
| 2004/0043149 | A1 | 3/2004 | Gordon et al. |
| 2004/0044127 | A1 | 3/2004 | Okubo et al. |
| 2004/0102031 | A1 | 5/2004 | Kloster et al. |
| 2004/0203254 | A1 | 10/2004 | Conley et al. |
| 2004/0206267 | A1 | 10/2004 | Sambasivan et al. |
| 2005/0112282 | A1 | 5/2005 | Gordon et al. |
| 2005/0178336 | A1 | 8/2005 | Liu |
| 2005/0181617 | A1* | 8/2005 | Bosch ................ 438/710 |
| 2007/0275569 | A1 | 11/2007 | Moghadam et al. |

FOREIGN PATENT DOCUMENTS

| | | |
|---|---|---|
| JP | 2004-256479 | 9/2004 |
| WO | WO02/27063 | 4/2002 |
| WO | WO 03/083167 A1 | 9/2003 |

OTHER PUBLICATIONS

Hausmann et al., "Rapid Vapor Deposition of Highly Conformal Silica Nanolaminates," Science, vol. 308, Oct. 2002, 5 Pages.

Gordon et al., "A Kinetic Model for Step Coverage by Atomic Layer Deposition in Narrow Holes or Trenches", Chemical Vapor Deposition 2003, 9, No. 2, pp. 73-78.

Greer et al., "Method and Apparatus to Reduce the Frequency of Chamber Cleans in Rapid Vapor Deposition (RVD) of Silicon Oxide", Novellus Systems, Inc., filed Jul. 12, 2004, U.S. Appl. No. 10/890,376, pp. 1-25.

U.S. Office Action mailed Sep. 22, 2005, from U.S. Appl. No. 10/874,814.

U.S. Office Action mailed Jun. 23, 2005, from U.S. Appl. No. 10/874,808.

Ritala et al., "Atomic Layer Deposition", Handbook of Thin Films Materials, vol. 1, 2002, pp. 103-159.

U.S. Office Action mailed Oct. 6, 2005, from U.S. Appl. No. 10/975,028.

Tarafdar et al., "Sequential Deposition/Anneal Film Densification Method", Novellus Systems, Inc., filed Sep. 11, 2006, U.S. Appl. No. 11/519,445, pp. 1-37.

U.S. Office Action mailed Dec. 7, 2005, from U.S. Appl. No. 10/874,808.

U.S. Office Action mailed Feb. 24, 2006, from U.S. Appl. No. 11/077,108.

U.S. Office Action mailed Mar. 24, 2006, from U.S. Appl. No. 10/975,028.

U.S. Office Action mailed May 23, 2006, from U.S. Appl. No. 11/077,198.

U.S. Office Action mailed Jan. 30, 2007, from U.S. Appl. No. 10/890,376.

Johanson et al., "Apparatus and Method for Delivering Uniform Fluid Flow in a Chemical Deposition System," Novellus Systems, Inc., U.S. Appl. No. 11/542,959, filed Oct. 3, 2006, pp. 1-26.

Krotov et al., "Deposition Sub-Chamber with Variable Flow," Novellus Systems, Inc., U.S. Appl. No. 11/626,328, filed Jan. 23, 2007, pp. 1-34.

PCT patent application No. PCT/US07/15979, International Search Report and Written Opinion dated Jan. 10, 2008.

U.S. Appl. No. 11/519,445, Office Action mailed Dec. 10, 2008.

U.S. Office Action mailed May 14, 2008, from U.S. Appl. No. 11/519,445.

U.S. Office Action mailed Dec. 10, 2008, from U.S. Appl. No. 11/519,445.

* cited by examiner

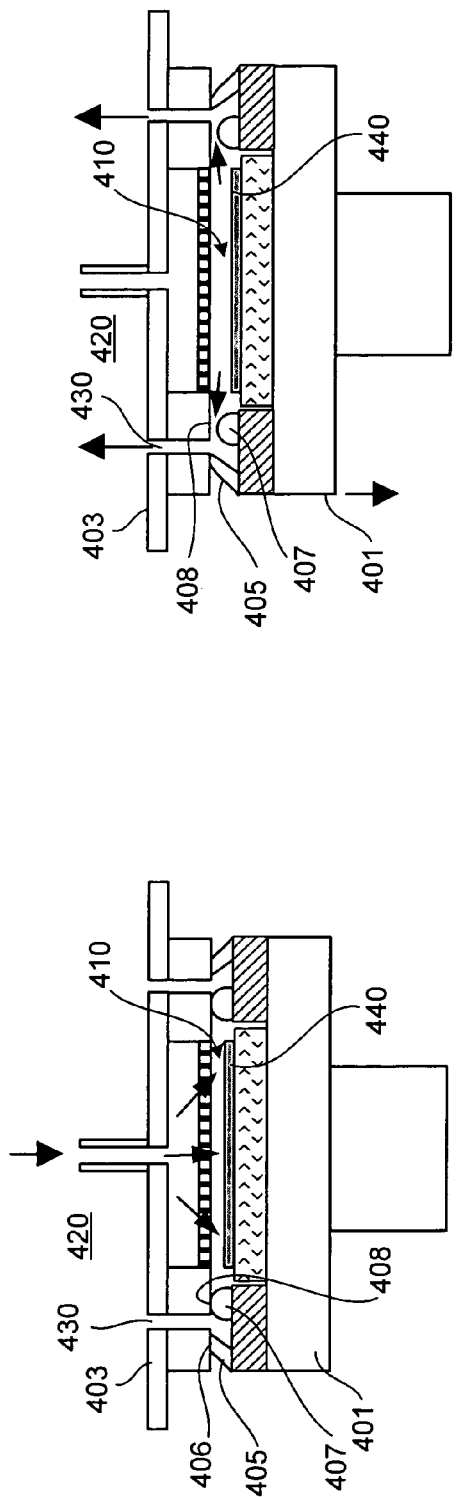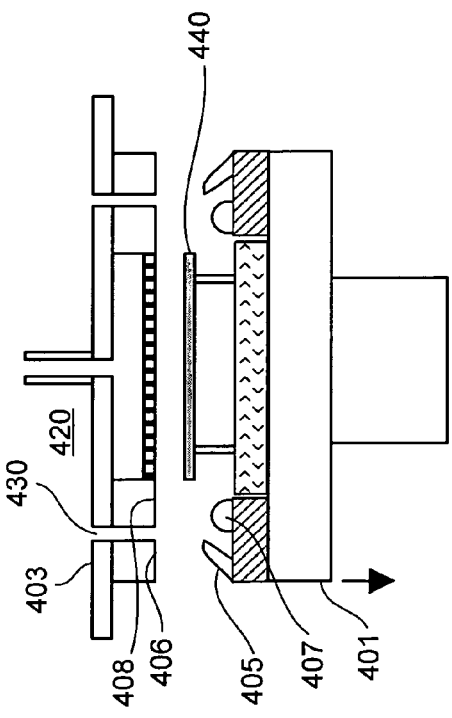

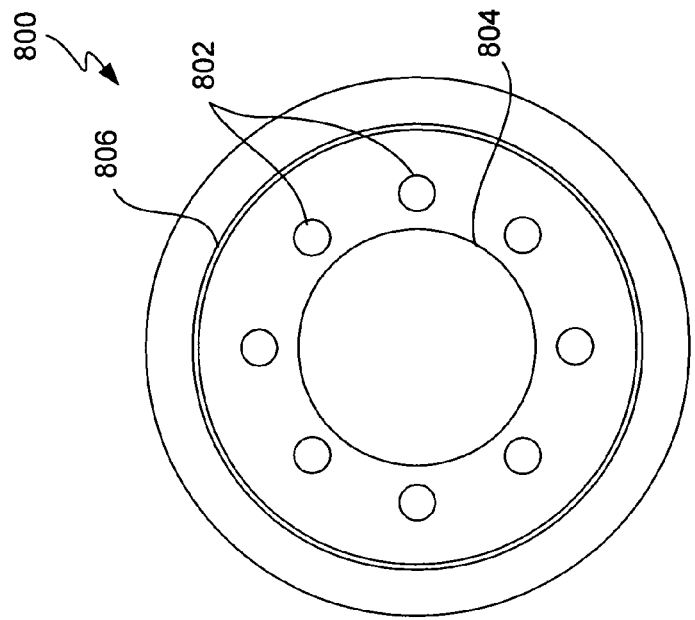
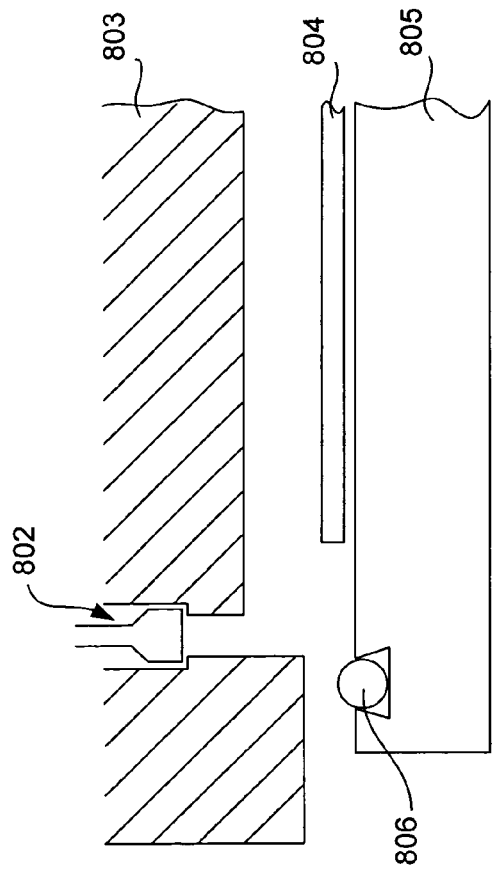
FIG. 8B
FIG. 8A

DUAL SEAL DEPOSITION PROCESS CHAMBER AND PROCESS

CROSS-REFERENCE TO RELATED PATENT APPLICATIONS

This application claims priority under 35 USC 119(e) from U.S. Provisional Patent Application No. 60/788,262 filed Mar. 31, 2006, naming Lind et al. as inventors, which is incorporated herein by reference in its entirety.

BACKGROUND OF THE INVENTION

This invention pertains to apparatus and processes for conducting chemical depositions, and may find particular use in depositing a conformal film of dielectric material with a high degree of surface smoothness particularly suited to high aspect ratio gap fill applications in semiconductor device fabrication.

Conformal, uniform dielectric films have many applications in semiconductor manufacturing. In the fabrication of sub-micron integrated circuits (ICs) several layers of dielectric film are deposited. Four such layers are shallow trench isolation (STI), premetal dielectric (PMD), inter-metal dielectric (IMD) and interlayer dielectric (ILD). Other applications of conformal dielectric films may be as sacrificial or permanent spacer layers, sacrificial or permanent storage node separation layers, or as dielectric liners for through-wafer vias. All of these layers require silicon dioxide or other low dielectric constant films that fill features of various sizes and have uniform film thicknesses across the wafer.

In particular, it is often necessary in semiconductor processing to fill a high aspect ratio gap with insulating material. As device dimensions shrink and thermal budgets are reduced, void-free filling of high aspect ratio (AR) spaces (AR>3.0:1) becomes increasingly difficult due to limitations of existing deposition processes. The deposition of doped or undoped silicon dioxide assisted by high density plasma CVD, a directional (bottom-up) CVD process, is the method currently preferred for high aspect ratio (AR) gap-fill in semiconductor fabrication production processes. Evolving semiconductor device designs and dramatically reduced feature sizes have resulted in several applications where HDP processes are challenged in filling the high aspect ratio structures (AR>7:1) using existing technology (see, for example, U.S. Pat. No. 6,030,881). For structures representative of the 65 nm and 45 nm technology nodes and beyond, engineering the gap-fill process becomes structure dependent, hence the process requires re-optimization, a task of considerable complexity, every time a new structure needs to be filled.

An alternative to CVD is atomic layer deposition (ALD). ALD methods involve self-limiting adsorption of reactant gases and can provide thin, conformal dielectric films within high aspect ratio features. The ALD process involves exposing a substrate to alternating doses of, usually two, reactant gases. As an example, if reactants A and B are first and second reactant gases for an ALD process, after A is adsorbed onto the substrate surface to form a saturated layer, B is introduced and reacts only with adsorbed A. In this manner, a very thin and conformal film can be deposited. One drawback, however, to ALD is that the deposition rates are very low. Films produced by ALD are also very thin (i.e., about one monolayer); therefore, numerous ALD cycles must be repeated to adequately fill a gap feature. These processes are unacceptably slow in some applications in the manufacturing environment.

Another more recently developed technique useful in gap fill and other dielectric deposition applications in semiconductor processing is referred to as pulsed deposition layer (PDL) processing, sometimes also referred to as rapid surface-catalyzed vapor deposition (RVD). PDL is similar to ALD in that reactant gases are introduced alternately over the substrate surface, but in PDL the first reactant A acts as a catalyst, promoting the conversion of the second reactant B to a film. In ALD the reaction between A and B is approximately stoichiometric, meaning that a monolayer of A can only react with a similar amount of B before the film-forming reaction is complete. The catalytic nature of A in PDL allows a larger amount of B to be added, resulting in a thicker film. Thus, PDL methods allow for rapid film growth similar to using CVD methods but with the film conformality of ALD methods.

PDL-type processes for forming silicon-based dielectrics can use as reactant A a metal or metalloid catalyst (e.g., trimethylaluminum (TMA)) or metal and metalloid-free catalysts (e.g., an organic acid such as acetic acid ($CH_3COOH$) or an inorganic acid such as phosphoric acid ($H_3PO_4$); and as reactant B, a silicon-containing dielectric precursor. As an example of the use of PDL to deposit silicon dioxide on silicon, the first (catalytic) reagent can be trimethylaluminum (TMA) and the second (silicon-containing) reagent can be tris t(pentoxy)silanol (TPOSL). A heated silicon substrate is first exposed to a dose of TMA, which is thought to react with the silicon surface to form a thin layer of surface-bound aluminum complex. Excess TMA is pumped or flushed from the deposition chamber. A large dose of TPOSL is then introduced. The aluminum complex catalyzes the conversion of the silanol to silicon oxide until the silanol is consumed, or the growing film covers or otherwise inactivates the catalytic complex. When excess silanol is used, the film growth is usually self-limiting and a thick and uniform film results. Unreacted silanol is then removed from the chamber and the growth cycle repeated.

The most significant difference between CVD and PDL or ALD is that in the latter case the catalyst and silicon-containing precursors are not present in the reactor at the same time. Instead, they are introduced sequentially, generally with a purging step in between to minimize gas-phase reactions and to improve step coverage and uniformity of the film.

In CVD, ALD, or PDL systems, a film is often deposited on the chamber walls in addition to the desired location, on the substrate (e.g., silicon wafer) surface. In ALD and PDL reactors, this unwanted deposition can occur as the precursors adsorb to the walls of the reactor in addition to the wafer surface and subsequently react to form film in later PDL/ALD steps. This film can build up on the chamber walls and can act as a source of chemical contaminants and particulates. It has been well documented for many CVD and ALD/PDL systems that a periodic cleaning of the chamber walls to remove these deposits is beneficial. If these chamber cleans are not performed, the film stresses may be so large that the film delaminates from the chamber wall, leading to particle deposition on the wafer surface. However, these chamber cleans reduce chamber productivity.

It is therefore desirable to develop a method and apparatus for minimizing unwanted film growth on reaction chamber walls, thus minimizing or eliminating altogether the need to perform chamber cleans in order to keep the particle performance of the chamber within acceptable limits and thereby improving the availability of the tool for processing wafers.

SUMMARY OF THE INVENTION

The present invention provides an apparatus and method for sealing and unsealing a chemical deposition apparatus. The apparatus includes a microvolume that has dual sealing elements at its periphery. One seal, the outer seal, is used to seal the inside of the volume from the main process chamber. The second (inner) seal is used to seal the inside of the microvolume from a vacuum source. The apparatus and process of the present invention has several advantages, including:

The dual-seal arrangement incorporates the sealing function and mechanism into the wafer handling mechanism by using the pedestal and/or showerhead module motion to sequence and actuate at least part of the dual seal.

The dual-seal arrangement of the invention incorporates the sealing function and mechanism into the wafer handling mechanism by using the pedestal and/or showerhead module motion to sequence and actuate at least part of the dual seal.

The dual-seal arrangement provides the sealing point very near the wafer edge allowing minimal chamber volume and reducing or eliminating dead legs (area that is a dead end without fluid flow through; that can become a refuge for by-products or particles that are very difficult to remove by purging the chamber). A very small deposition chamber volume in the form of the microvolumes formed by engagement of the pedestal and showerhead modules and operation of the dual seal also results in minimized chemical usage.

The dual-seal arrangement provides a sealing element concentric to the wafer. As such it can provide a concentric pumping or unsealing that can facilitate axis-symmetric flow to the wafer; symmetric flow during post-exposure microvolume evacuation preserves film uniformity.

The dual-seal arrangement provides a vacuum path from the microvolume when only the outer seal is engaged. This greatly facilitates station isolation in multi-station reactors by minimizing the amount of precursor exposure to the main process chamber and helps avoid the need for an in situ clean.

The use of elastomeric seals to form the dual seal in various embodiments is mechanically simple, resulting in low cost and complexity of apparatus fabrication and operation, low maintenance and greater productivity.

In one aspect, the invention relates to a chemical deposition process chamber apparatus. The apparatus includes a substrate pedestal module comprising a substrate support region; a showerhead module comprising process fluid injection outlets; and a dual seal composed of one or more seal members comprised by either or both of the substrate pedestal module or the showerhead module, the one or more seal members operable to form a plurality of circumferential seals around a microvolume encompassing the substrate support region. In a first position, the one or more seals are operable to form an inner vacuum-tight seal separating a main process chamber from the inside of the microvolume and a vacuum source fluidly connected with the microvolume. In a second position, the one or more seals are operable to form an outer vacuum-tight seal separating the main process chamber from the inside of the microvolume and from the vacuum source. In a third position, the dual seal may be completely open so that there is no vacuum-tight separation of the substrate support region and the main process chamber.

In one embodiment of the apparatus the one or more seal members comprise a pair of concentric elastomeric seals. The pair of concentric elastomeric seals can be an inner O-ring circumscribed by an outer lip seal. The pair of concentric elastomeric seals can be borne by the pedestal module, the showerhead module, or a combination. At least the inner O-ring seal can be composed of a material that retains its elastomeric properties at a temperature between $-100°$ C. and $300°$ C., upon exposure to chemicals used in the deposition process, and with mechanical cycling (repeated sealing and unsealing); and has low or no particulate generation or chemical outgassing with mechanical cycling. An example of a suitable material is a perfluoroelastomer. The perfluoroelastomer may include a filler a particulate filler, that may be a nano-particulate.

Either or both of the pair of circumferential seals can be engaged with one of the modules in a channel circumferential to the substrate support region and operable to engage with the other of the modules by contact to form a seal. For example, an outer lip seal channel may include a re-entrant feature on its lower outer sidewall that engages a tab on the lip seal. The upper inner sidewall of the lip seal channel can have a cut away to accommodate compression of the seal when it is engaged, particularly when the seal is fully closed.

According to another alternative, the one or more seal members can include a concentric elastomeric seal and a plurality of discrete vacuum channels and valves disposed concentrically about the elastomeric seal. In this configuration, the inner seal, between the vacuum source and the deposition region of the microvolume, is created by the plurality of discrete vacuum channels and valves, which may be located in the showerhead module. The outer seal, between the microvolume and the main reactor chamber, is formed by a concentric elastomeric seal, such as an O-ring.

Alternatively, the one or more seal members can include a single elastomeric seal member mounted on a flexible element operable to engage each of the modules with a separate contact area to provide the plurality of circumferential seals defining the microvolume with (outer seal engaged only) and without (both inner and outer seals engaged) a fluid path to the vacuum source. The seal element can be composed of a suitable elastomeric material as described above with reference to the concentric elastomeric seals, and the flexible element can be a metal.

In another aspect, the invention relates to a multi deposition station system (MDSS) for chemical deposition processing having one or more stations with a chemical deposition process chamber apparatus as described above.

In another aspect, the invention relates to a method of conducting a chemical deposition process in a dual seal apparatus. The method generally involves providing a deposition substrate to a substrate support region of a deposition chamber having a dual seal configuration as described herein. An outer circumferential seal defining a volume encompassing the substrate support region and fluidly connected with an evacuation apparatus is formed. An inner circumferential seal that seals the substrate support region from the evacuation apparatus to form a deposition microvolume is also made. A chemical deposition is conducted in the microvolume. The inner seal is then opened and the microvolume evacuated. The outer seal is then opened and the substrate is removed from the substrate support region, for example by indexing of wafers in a multiple deposition station system (MDSS).

According to another aspect of the invention, in order to avoid wafer floating and/or backstreaming, particularly where a plurality of deposition chambers having the dual seal apparatus described above are combined in a multi-station deposition system (MDSS) reactor in which the plurality of deposition chambers share a common vacuum foreline for the evacuation apparatus, the inner seal can be opened gradually.

Gradual opening of the inner seal prevents a sudden pressure release that can cause wafer float and/or backstreaming of the gas flow from one chamber to another.

These and other features of the invention will be further described and exemplified in the drawings and detailed description below.

BRIEF DESCRIPTION OF THE DRAWINGS

FIGS. 4A-C illustrate relevant features of the structure and operation of an embodiment of the present invention having two elastomeric seals located concentrically on the pedestal with their sealing positions offset in the vertical direction.

FIGS. 8A-B illustrate in lateral and vertical cross-sections, respectively, another alternative implementation of the invention having a plurality of discrete valves arranged peripherally around the microvolume can be used in combination with a circumferential elastomeric seal to form the inner and outer seals of the dual seal, respectively.

DETAILED DESCRIPTION OF SPECIFIC EMBODIMENTS

Figure 1:
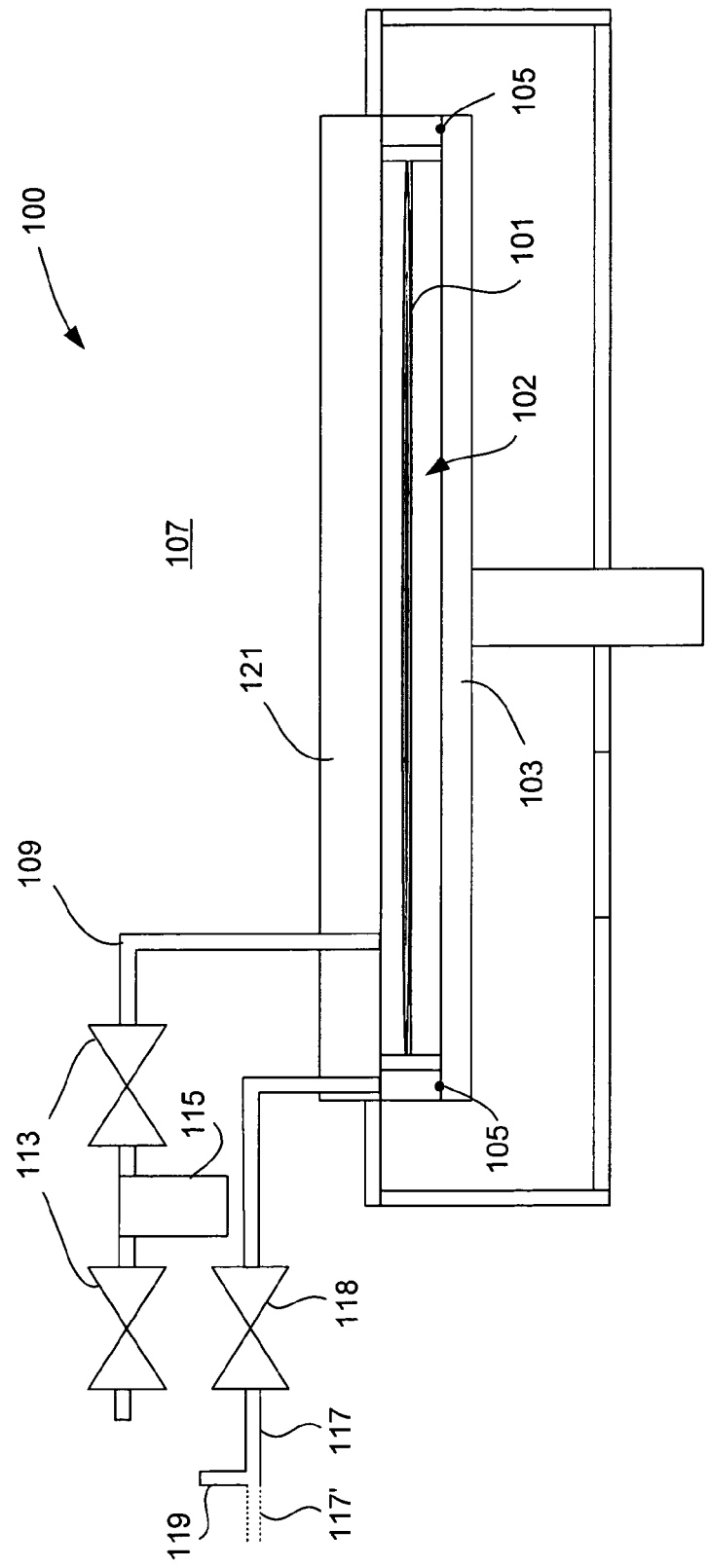
FIG. 1 is a schematic cross-sectional diagram showing relevant basic features of a chemical deposition station in accordance with which the present invention can be implemented.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances, well-known processes, procedures and components have not been described in detail so as not to unnecessarily obscure aspects of the present invention.

Introduction

As indicated, the present invention provides an apparatus and associated method for conducting a chemical deposition. The apparatus and method are particularly applicable to use in conjunction with a semiconductor fabrication based dielectric deposition process that requires separation of self-limiting deposition steps in a multi-step dielectric deposition process (e.g., atomic layer deposition (ALD) or pulsed deposition layer (PDL) processing for catalyst and silicon precursor deposition), however they are not so limited. In some instances, the apparatus and process of the invention are described with reference to such PDL embodiments.

Generally, a PDL process involves sequentially depositing a plurality of atomic-scale films on a substrate surface by sequentially exposing and removing reactants to and from the substrate surface. An exemplary case of PDL processing using reactant gases A and B will now be used to illustrate principle operations of a PDL process in accordance with the present invention. First, gas A is injected into a chamber and the molecules of gas A are chemically or physically adsorbed to the surface of a substrate, thereby forming a "saturated layer" of A. Formation of a saturated layer is self-limiting in nature and represents a thermodynamically distinct state of adsorbed A on a surface. In some cases, a saturated layer is only one monolayer. In other cases, a saturated layer is a fraction of a monolayer, or some multiple of monolayers.

After a saturated layer of A is formed, typically, the remaining gas A in the chamber is purged using an inert gas and/or pumped using a vacuum pump. Thereafter, the gas B is injected so that it comes in contact with the adsorbed layer of A and reacts to form a reaction product of A and B. Because the saturated layer of A is thin and evenly distributed over the substrate surface, excellent film step coverage (i.e., conformal films) can be obtained. B is flowed over the substrate for a period of time sufficient to allow the reaction between A and B to preferably go to completion; i.e., all of the adsorbed A is consumed in the reaction. In a PDL process, B is flowed over the substrate for a period of time sufficient for a large enough quantity of B to be exposed to the substrate, resulting in a film formation in excess of one monolayer. After a desired quantity of B is delivered, the flow of B is stopped. There may be an optional soak time after stopping the delivery of B, to allow enough time to fully complete the reaction. At this point, residual gas B and any byproducts of the reaction are purged and/or pumped from the chamber. Further PDL cycles of exposure to A, followed by exposure to B, can be implemented and repeated as needed for multiple layers of material to be deposited.

Another deposition technique related to PDL is atomic layer deposition (ALD). PDL and ALD are both surface-controlled reactions involving alternately directing the reactants over a substrate surface. Conventional ALD, however, depends on self-limiting, typically-monolayer-producing reactions for both reactant gases. As an example, if reactants C and D are first and second reactant gases for an ALD process, after C is adsorbed onto the substrate surface to form a saturated layer, D is introduced and reacts only with adsorbed C. In this manner, a very thin and conformal film can be deposited. In PDL, as previously described using exemplary reactants A and B, after A is adsorbed onto the substrate surface, B reacts with adsorbed A and is further able to react to accumulate a self-limiting, but much thicker than one monolayer, film. Thus, as stated previously, the PDL process allows for rapid film growth similar to using CVD methods but with the conformality of ALD methods.

ALD and PDL methods are related to the well-established chemical vapor deposition (CVD) techniques. However, in CVD, the chemical reactant gases are simultaneously introduced in a reaction chamber and allowed to mix and chemically react with each other in gas phase. The products of the mixed gases are then deposited on the substrate surface. Thus, ALD and PDL processing methods differ from CVD since in ALD and PDL the chemical reactant gases are individually injected into a reaction chamber and not allowed to mix prior to contacting the substrate surface. That is, ALD and PDL are based on separated surface-controlled reactions.

Unfortunately, as indicated above, when PDL processes are performed in a single chamber where A and B are allowed to mix freely, there will be a film build-up on the interior walls and components of the reaction chamber as well as on the substrate surface. However, if processes A and B are isolated from each other, there will be no sidewall build-up beyond a single monolayer and the chamber will rarely, if ever, need to be cleaned.

Some structural solutions to address this issue have been proposed, for example in co-pending, commonly assigned application Ser. No. 10/890,376, filed Jul. 12, 2004 and titled METHOD AND APPARATUS TO REDUCE THE FREQUENCY OF CHAMBER CLEANS IN RAPED VAPOR DEPOSITION(RVD) OF SILICON OXIDE, which describes a multiple deposition space processing reactor suitable for conducting PDL. The disclosure of this application relating to the design and operation of a multiple deposition space processing reactor suitable for conducting PDL is incorporated herein by reference. The system has distinct advantages in terms of wafer handling-related process performance and efficiency relative to multiple reactor systems, and in terms of chamber cleaning requirements for single deposition space reactors. Since the precursors are not put into the same deposition space (chamber or chamber region), they do not readily react to deposit and accumulate film on the walls of the chamber. Since there is little or no film growth on the chamber walls, the number of in situ plasma cleans required to keep the particle performance of the chamber within acceptable limits is minimized. This dramatically improves the availability of the tool for processing wafers.

Even with this separation of the deposition spaces within the main reactor chamber, for example as provided by separate deposition microvolumes formed by engagement of pedestal and showerhead assemblies, unwanted cross talk (co-mingling) of precursors can occur. In particular, sufficient reactant B (e.g., silicon-containing precursor such as TPOSL) can be present when the microvolumes unseal following reactant B exposure to enable the unwanted cross talk.

In addition, in some implementations of a deposition reactor suitable for conducting PDL, a multi-station arrangement is used. In one implementation of such a multi-station reactor, four stations, each having its own microvolume formed by engagement of separate pedestal and showerhead assemblies at each station, are provided within the main reactor process chamber. In a PDL process, two of the stations are used for exposure of catalyst (i.e., reactant A, e.g., TMA) to the substrate and two are used for exposure of a silicon-containing precursor (i.e., reactant B, e.g., TPOSL).

In operation, a PDL process module in the reactor delivers process chemistry into each of the four microvolumes. The process pressure can reach 20T or more for two of the microvolumes, and these microvolumes may share a common foreline. Once the process is complete, the chamber needs to be unsealed and the gas evacuated. With throughput as a concern, the gas must be evacuated quickly when the microvolume is opened. However, sharp pressure changes can allow pressure differentials between the top and bottom surfaces of the wafer that can float the wafer; increasing the likelihood of particle generation, damage to the wafer and misalignment of the wafer with the wafer handling apparatus. This is particularly problematic due to the repeated process cycles that each wafer may see and the potential accumulation of effects of movement due to floating. Additionally, in a common reactor configuration that uses a shared foreline for microvolumes to which the same reactants are supplied, these microvolumes may not open exactly the same causing backstreaming of gas from one station (microvolume) to the other.

Thus, improved microvolume sealing apparatus and methods, and improved control of microvolume unsealing and evacuation would be desirable.

The present invention provides chemical deposition apparatus having a small volume chamber, the microvolume, that has dual sealing elements at its periphery. One seal, the outer seal, is used to seal the inside of the volume from the main process chamber, the second (inner) seal is used to seal the inside of the volume from a vacuum source. In this aspect, the invention provides a chemical deposition process chamber apparatus, comprising: a substrate pedestal module comprising substrate support region; a showerhead module comprising process fluid injection outlets; one or more seal members comprised by either or both of the substrate pedestal module or the showerhead module, the one or more seal members operable to engage either or both of the modules to provide a plurality of peripheral seals defining a greater volume and a lesser volume within the greater volume encompassing the substrate support region and exposed to the showerhead module process fluid injection outlets; and evacuation apparatus fluidly connected with the greater volume and not the lesser volume.

In a process aspect, the invention allows a wafer to be transferred into a microvolume (i.e., a small chemical exposure chamber) while at vacuum. The microvolume closes by engagement of the pedestal and showerhead modules and closure of inner and outer peripheral seals. In the microvolume the wafer is exposed to a chemical in a stopped flow method (dose) at a specific delivery amount (generally measured in micro-moles) and for a specific time. The chemical is then removed (purged) from the microvolume by opening the microvolume sufficiently to break the inner seal while the outer seal remains intact. A path to vacuum is opened when the inner seal is broken, allowing gas in the microvolume to evacuate. The outer seal can then be broken and the microvolume opened to remove the wafer without releasing appreciable amounts of the chemical into the main process chamber.

Dual Seal Apparatus

FIG. 1 is a schematic cross-sectional diagram showing relevant basic features of a chemical deposition station in accordance with which the present invention can be implemented. The station 100 has a vacuum/flow environment around a region 102 where the deposition substrate (e.g., wafer) 101 is positioned during exposure to chemical reactants that is within but separate from the main reactor volume 107. This region 102 is defined by walls composed of the inner surfaces of a module that supports the substrate and a module that provides the chemical reactants, and is referred to herein as a "microvolume" 102. This is generally accomplished by having the wafer 101 on a moving pedestal module 103 that can be raised or lowered relative to a showerhead module 121 to either close or open the station. Alternatively, the station is can be opened or closed by raising or lowering the showerhead module 121 or by movement of both the pedestal and the showerhead modules. A hinged configuration is also possible. While closed, there can be a separate flow of precursors to, and a separate vacuum evacuation from, the deposition region, the microvolume 102.

Precursors are introduced into the microvolume via lines, represented by 109. Each line may have a corresponding accumulator 115, and can be isolated from the microvolume using isolation valves 113. Note that the apparatus may be modified to have one or several more lines along with corresponding isolation valves and accumulators, depending on the number of precursors used. Also, the microvolume 102 is evacuated through vacuum lines, represented by 117, that are connected to a vacuum source, such as a vacuum pump, and can be isolated from the microvolume using an isolation valve 118. In multi-station reactors, particularly those having multiple stations that perform the same deposition process, a vacuum line 117 from another station may share a common foreline 119 with the vacuum line 117. Also, precursor delivery lines may be shared between multiple stations. A hot wall in the showerhead module 121, which is capable of producing temperatures greater than room temperature, is used to maintain the proper temperature inside the enclosure. In a preferred embodiment, the showerhead walls can be heated to greater than 250° C., and/or the pedestal can be heated to greater than 250° C.

The station 100 includes a seal 105 at the point of engagement of the pedestal 103 and showerhead 121 modules. In accordance with the present invention, and as described in further detail with reference the several specific embodiments below, the seal is a dual seal and generally includes at least one circumferential elastomeric seal portion. The circumferential elastomeric seal(s) should be composed of a material with thermal and chemical stability to the temperatures and reactants in the operating environment of the reactor. For example, in various implementations, the material would normally be subjected to temperatures ranging from about −100 to 300° C., although stability over a subset of this full range will be adequate for most applications. In semiconductor applications, stability to acidic and metallic catalysts and silicon-containing precursors used in ALD or PDL gap fill applications would be needed. The material should also have adequate resistance to mechanical cycling to be able to retain its elastomeric sealing and other important properties through repeated opening and closing of the microvolume. In addition, the material should generate few or no particulates in the course of reactor operations and should have little or no chemical outgassing. Suitable materials for preferred implementations include prefluoroelastomers. Examples include KALREZ, available from DuPont and G-67P, available from Perlast. The latter is a nano-filled perfluoroelastomer that is particularly preferred in many applications. In some instances, such as where a dual-circumferential elastomeric seal is used, the desired properties of the elastomeric material may be more applicable to one of the seals than the other, as will be discussed further below, and VITON may also be used as a seal material.

An advantage of this configuration is that the total volume inside the station 100 is much smaller than the main reactor volume. For example, using a 2-3 mm gap between the wafer and the lower surface of the showerhead and a 300 mm wafer, the total volume of the station may be less than about 0.25 L.

Figure 2:
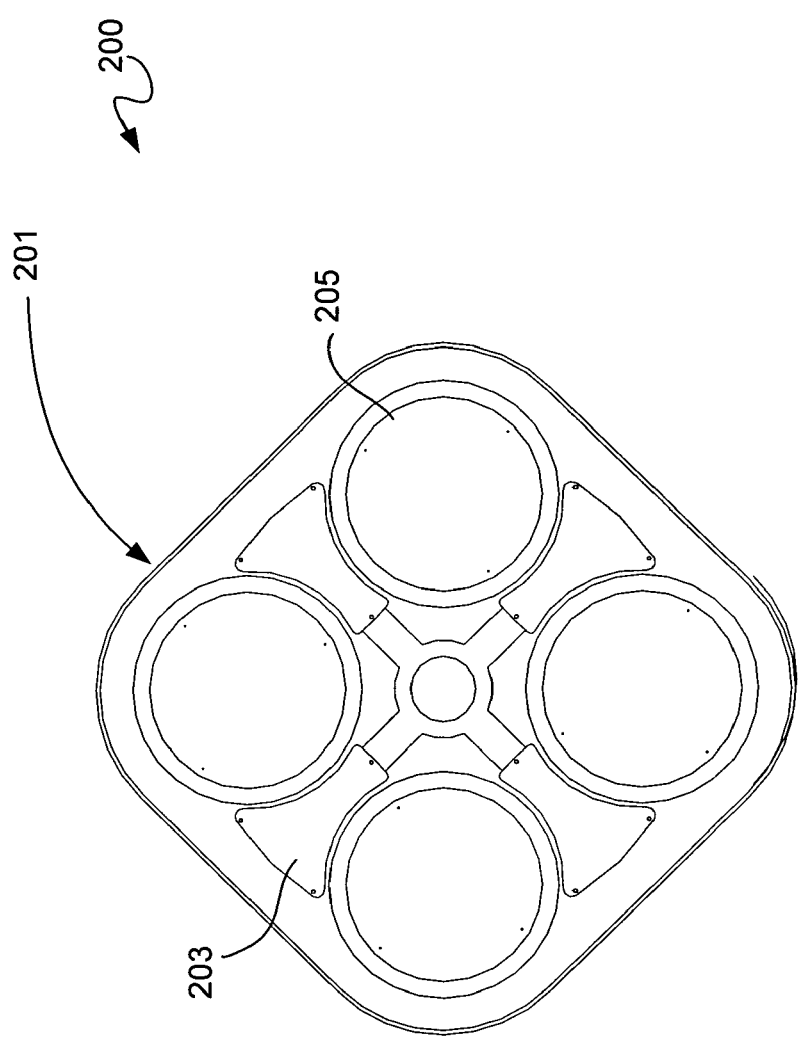
FIG. 2 is a schematic diagram showing relevant features of a single chamber, multi-station reactor system in accordance with which the present invention can be implemented.

FIG. 2 is a schematic diagram showing relevant features of a single chamber, multi-station reactor system in accordance with which the present invention can be implemented. Four stations 201 are contained within a single main reactor chamber vacuum enclosure 200 with a single robotic spindle mechanism 203 for moving wafers 205 between stations. In PDL implementations, some stations are used to apply a catalytic precursor only, such as TMA, and some stations are used to apply a silicon-containing precursor. Some or all of the stations can have a dual seal configuration and operation in accordance with the present invention. In some embodiments for conducting PDL, the stations are used to apply the silicon-containing precursor have the dual seal configuration, while the stations used to apply the catalytic reactant can have a single seal configuration. Each station deposition microvolume as described basically above, and in more detail with respect to specific embodiments below, is isolated from other stations by seals.

The number of stations in a particular reactor will depend upon available space, but typically the number of each kind of station is a multiple of the number of reactants used in the process. As an example, if two reactants are used, then there may be two, four or six stations (for instance, four: two of reactant A and two of reactant B). If three reactants are used, then there could be three or six stations (for instance, six: two of reactant A, two of reactant B, and two of reactant C).

Typically, the order of running the wafers 205 would be sequentially from a station running reactant A, then to B, then to C, etc., with a repetition of this cycle if there were more than one of each kind of station or by returning the wafers to the stations that had already been visited. In this way it is possible to accomplish the number of cycles that may be required to grow a film of a desired thickness without leaving the vacuum enclosure of the main reactor chamber 200. Of course, variations on this arrangement are also possible. For example, reactant B can be run before reactant A; prior to any reactant exposure, the first step is can be a preheat step; and multiple doses of reactants A or B can be accommodated at each station before indexing to next station.

An example of a multi-station reactor system suitable for conducting PDL-based dielectric gap fill is a four station reactor with two stations of reactant A (catalyst) and two stations of reactant B (silicon-containing). Upon entering the reactor, the wafer 205 is placed on the first station which would deposit reactant A. The wafer 205 is then moved by spindle mechanism 203 to station 2, where reactant B is deposited. Wafer 205 is then moved to station 3 where a second layer of reactant A is deposited. The wafer is then moved to station four and a second layer of reactant B is deposited. At this point, the wafers are removed from vacuum enclosure 200 or, alternately, more layers of reactants A and B may be deposited until a desired film thickness is reached.

Figure 3:
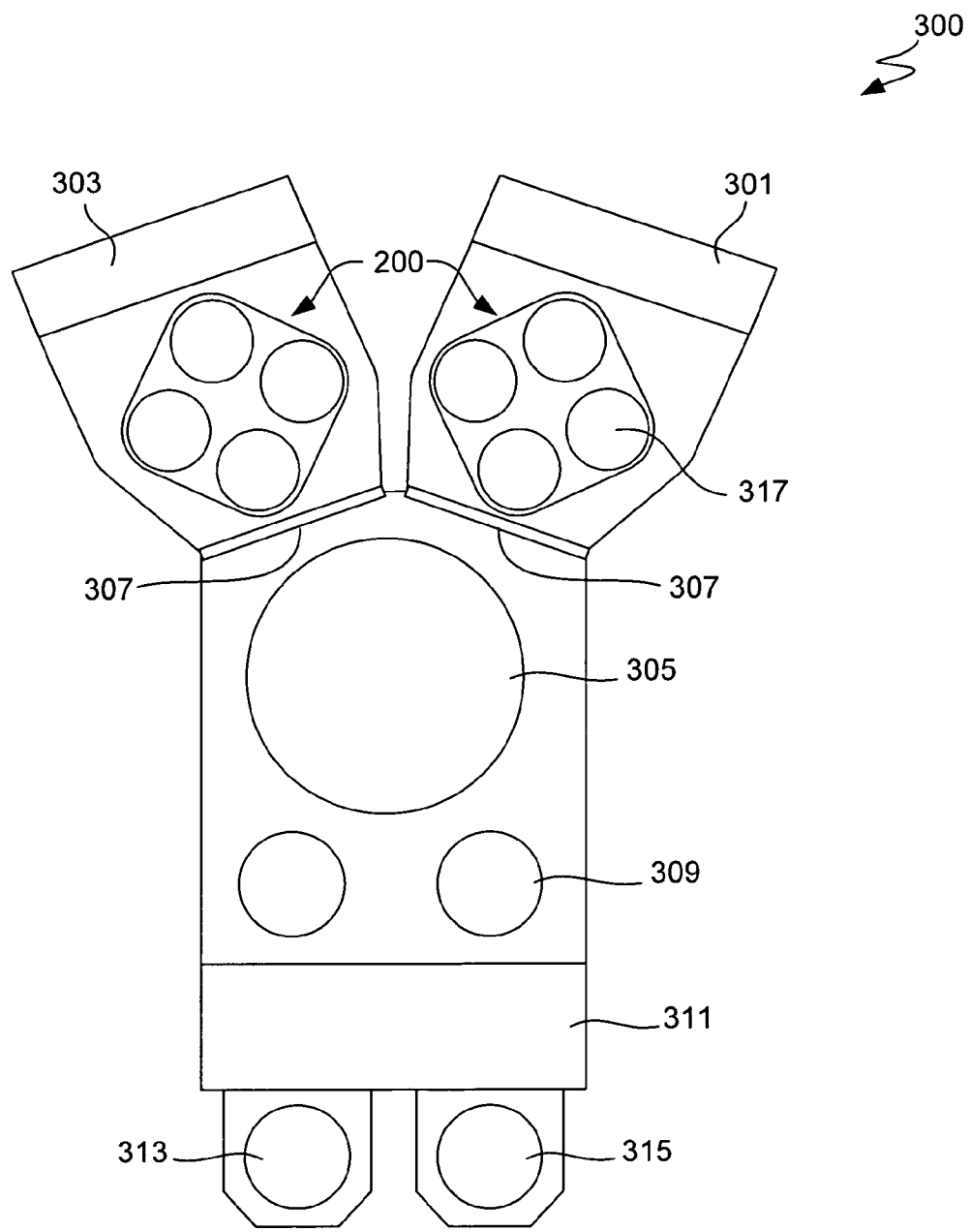
FIG. 3 is a schematic diagram showing relevant features of a two-chamber multi-station process module incorporating two systems such as shown in FIG. 2.

FIG. 3 is a schematic diagram showing relevant features of a two-chamber multi-station process module incorporating two systems 200 such as shown in FIG. 2. Multi-station module 300 is shown with process module 301 and process module 303. Each process module is physically connected to wafer transfer mechanism 305. Two vacuum-tight doors 307, one for each chamber, separate process modules 301 and 303 from wafer transfer mechanism 305. In order to avoid contamination of the wafer transfer mechanism 305 by chemicals used for deposition in process module 301 and 303 when airtight doors 307 are opened, the pressure in the wafer transfer mechanism is kept slightly higher than that in each station. For example, a ΔP of about 0.2-0.7 Torr (e.g., 0.5) may be used. Vacuum pumps 309 are used to maintain the proper level of vacuum in module 300. A wafer handler 311 is used to transfer wafers into wafer transfer mechanism 305. Semiconductor wafers are supplied to the process module via wafer cassettes 313. In a specific embodiment of the invention, wafer cassettes 313 (also known as FOUPs: Front Opening Unified Pods) hold 25 300 mm wafers each. Process modules 301 and 303 are, in one embodiment of the invention, arranged as described with reference to FIG. 2, with a four-station 317 reactor 200 per module.

In the various embodiments described above, and in the specific case of PDL $SiO_2$, one station is dedicated to exposure of the catalyst (e.g., aluminum-containing precursor), which may be trimethyl aluminum, while another station is dedicated to exposure of silanol or another silicon-containing precursor. Individual stations can be constructed or lined with materials suitable for the processes that will be performed within each station, as will be understood by those of skill in the art. For example, aluminum may be used as the principal material for fabrication of the chambers, reactors and apparatus described herein.

The dual seal concept of the present invention can be implemented in several different ways. In some embodiments, the dual seals are actuated by pressing the pedestal against the showerhead. The motion of the pedestal sequences the seals to provide the desired process conditions. In other embodiments, the dual seal actuation involves separate and/or additional mechanisms.

The use of two elastomeric seals located concentrically on the pedestal 401, with their sealing positions offset in the vertical direction (direction of pedestal travel) to allow them to sequence as described is one preferred embodiment. FIGS. 4A-C provide illustrations showing relevant features of the structure and operation of such an embodiment of the invention. In this embodiment, the first seal (outer seal, between the microvolume 410 and the main reactor chamber 420) is made when the pedestal 401 and the showerhead 403 modules come together and the higher vertically offset outer elastomeric seal 405 contacts a sealing surface 406 on the showerhead module 403. The outer elastomeric seal is ideally maximally deformable and resistant to mechanical cycling while still able to retain the seal so that the cross-sectional area of the gap available for pumping during evacuation of the microvolume 410, as illustrated in FIG. 4B below, can be maximized. A lip seal is one preferred configuration for the outer seal element. The second seal (inner seal, between the vacuum source 430 and the deposition region of the microvolume 410) is made as the pedestal travel continues, the outer (lip) seal deflects, and the inner elastomeric seal 407 makes contact with a sealing surface 408 on the showerhead module 403, sealing off the vacuum source 430. The inner seal ideally has chemical resistance to all reactants used in operation of the apparatus and does not generate particles during repeated sealing and unsealing operations. An O-ring seal is one preferred configuration for the inner seal element.

FIG. 4A shows the apparatus in the fully closed position with both seals engaged. This is the position during deposition. FIG. 4B shows the apparatus in the half-closed position with the outer seal 405 closed but the inner seal 407 open. This is the position during evacuation of the residual deposition reactants following deposition. FIG. 4C shows the apparatus in the open position with the both seals open. This is the position for transfer of the wafer 440 in or out of the station's microvolume 410.

Of course, one or both seals can also be borne by the showerhead module, and the microvolume can be opened or closed by movement of either or both of those modules.

Figure 5:
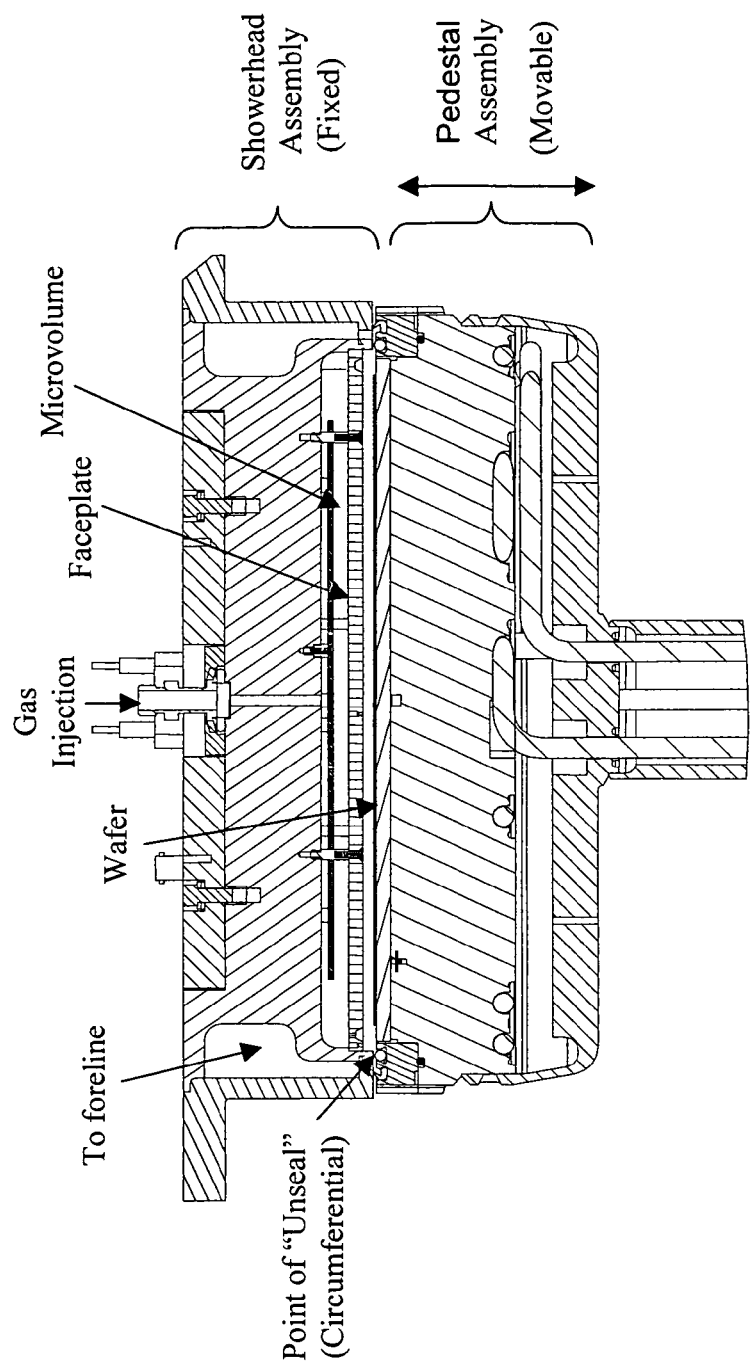
FIG. 5 illustrates an example of the embodiment described with reference to FIGS. 4A-C in further detail.

FIG. 5 illustrates an example of the embodiment described with reference to FIGS. 4A-C in further detail. The illustrated embodiment has the dual circumferential elastomeric seals mounted on the pedestal. Other features are discussed above are labeled.

Figure 6:
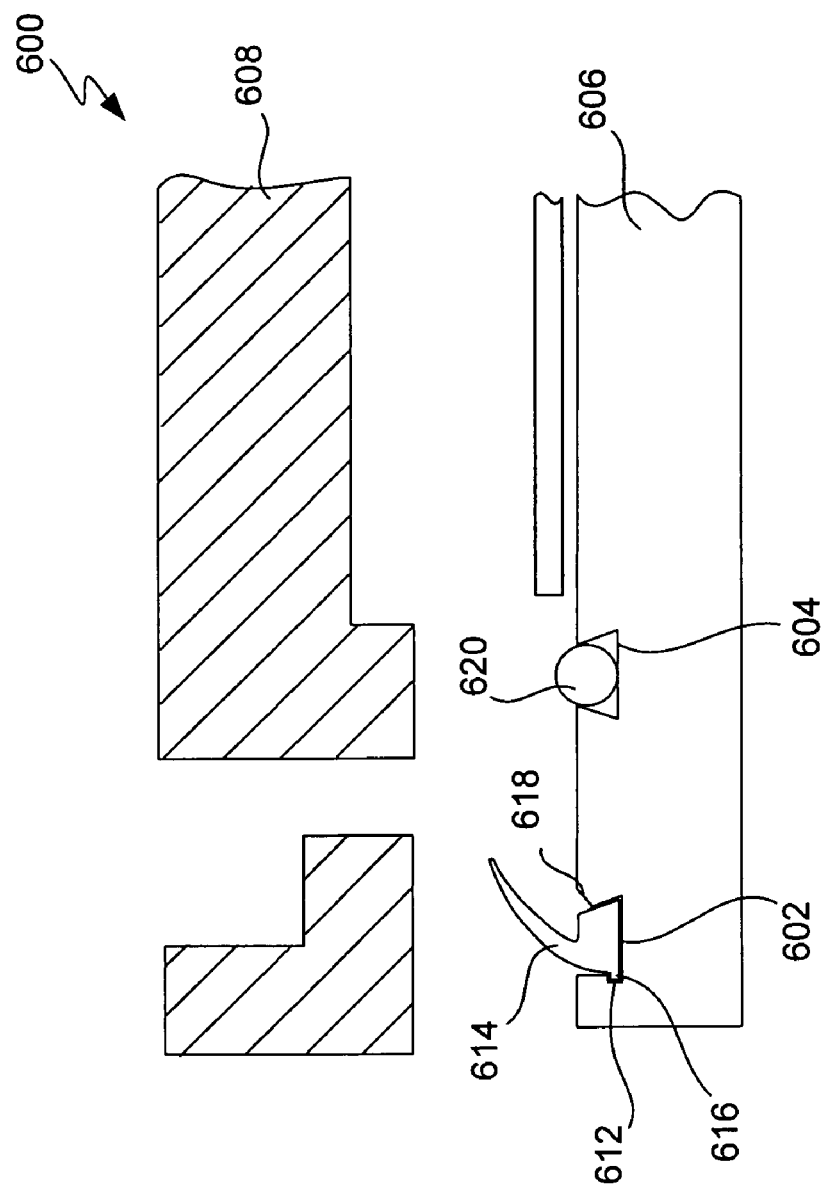
FIG. 6 shows a dual circumferential elastomeric seal embodiment as described with reference to FIGS. 4A-C and 5 with the elastomeric seals and their associated mounting features on the pedestal.

In a preferred implementation of the dual circumferential elastomeric seal embodiment described with reference to FIGS. 4A-C and 5, above, the elastomeric seals and their associated mounting features on the pedestal, for example, module have a particular geometry. An example of this embodiment 600 is shown in FIG. 6. The mounting features for both seals are circumferential channels 602, 604 in the surface of the pedestal 606 that will engage with the showerhead module 608 to form the deposition microvolume. The channel 602 for the outer seal is configured with a reentrant feature 612 on the lower portion of its outer wall, and the outer elastomeric seal 614 is a lip seal configured with a corresponding tab 616, so that the channel feature 612 and the tab 616 fit together in a lock-and-key manner. This configuration retains the elastomeric seal 614 in place, preventing it from popping out of the channel 602 when the lip seal is engaged. The upper portion of the inner wall can also be configured to have a cut-away 618 to provide clearance for the elastomeric lip seal as it folds down when engaging the showerhead module to form the seal. The channel 604 for the inner seal in the illustrated embodiment has a dovetail shape that holds an elastomeric O-ring inner seal element 620 in place.

Figure 7:
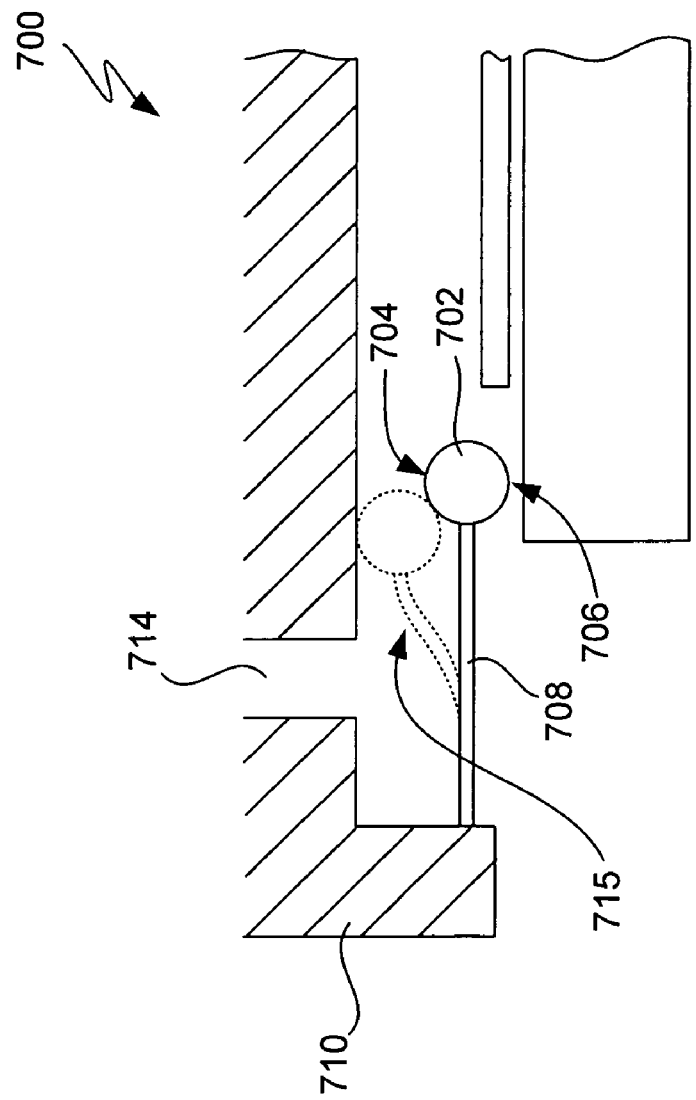
FIG. 7 illustrates an alternative embodiment of the invention in which a seal element that has sealing surfaces on its top and bottom surfaces and is mounted on a flexible element can be used to form inner and outer seals.

FIG. 7 illustrates an alternative embodiment 700 of the invention in which a seal element 702 that has sealing surfaces on its top 704 and bottom surfaces 706 and is mounted on a flexible element 708 can be used to form the inner and outer seals. The flexible element 708, which may be metal, plastic or another suitable material, is mounted to the showerhead module 710. This design allows the first seal (outer seal, between the microvolume and the main reactor chamber) to be made when the pedestal 712 contacts the bottom surface 706 of the sealing element 710. The second seal (inner seal) is made when the pedestal travel (and/or travel of the showerhead module relative to the pedestal) deflects the flexible element 708 allowing the top surface 704 of the seal element to contact the showerhead 710, sealing off the vacuum source 714. The latter (fully closed) position of the seal and flexible elements is represented by the broken line 715 in the figure. Given these specifications, one of skill in the art could readily determine an alternate configuration based on the principles of this embodiment, but with the flexible seal element mounted on the pedestal module.

According to a third alternative, illustrated in FIGS. 8A-B in lateral and vertical cross-sections, respectively, a plurality of discrete valves arranged peripherally around the microvolume can be used in combination with a circumferential elastomeric seal to form the inner and outer seals of the dual seal, respectively. In this embodiment 800, the inner seal, between the vacuum source and the deposition region of the microvolume, is created by a plurality of discrete vacuum channels and valves in the showerhead module 803 arranged peripherally around the deposition region of the microvolume (which, in operation, contains the wafer 804); and the outer seal, between the microvolume and the main reactor chamber, is formed by a concentric elastomeric seal 806, such as an O-ring seal, on the surface of the pedestal module 805. In operation, the discrete vacuum channel valves 802 of the inner seal open or close together to promote uniform gas flow across the wafer 804 and corresponding film uniformity.

The apparatus and process of the present invention has several advantages, including:

The dual-seal concept of the invention incorporates the sealing function and mechanism into the wafer handling mechanism by using the pedestal and/or showerhead module motion to sequence and actuate at least part of the dual seal.

The dual-seal concept provides the sealing point very near the wafer edge allowing minimal chamber volume and reducing or eliminating dead legs (area that is a dead end without fluid flow through; that can become a refuge for by-products or particles that are very difficult to remove by purging the chamber). A very small deposition chamber volume in the form of the microvolumes formed by engagement of the pedestal and showerhead modules and operation of the dual seal also results in minimized chemical usage.

The dual-seal concept provides a sealing element concentric to the wafer. As such it can provide a concentric pumping or unsealing that can facilitate axis-symmetric flow to the wafer; symmetric flow during post-exposure microvolume evacuation preserves film uniformity.

The dual-seal arrangement provides a vacuum path from the microvolume when only the outer seal is engaged. This greatly facilitates station isolation in multi-station reactors by minimizing the amount of precursor exposure to the main process chamber and helps avoid the need for an in situ clean.

The use of elastomeric seals to form the dual seal in various embodiments is mechanically simple, resulting in low cost and complexity of apparatus fabrication and operation, low maintenance and greater productivity.

Dual Sealing Methods

The present invention also provides a method of sealing and unsealing a chemical deposition chamber that involves forming and breaking a dual seal having inner and outer seals. The outer seal is formed between the deposition microvolume and the main reactor chamber, and the inner seal is formed between the deposition region of the microvolume and a vacuum source. As noted above, the dual seal may have various configurations.

In general, the invention provides a method of conducting a chemical deposition process in a dual seal apparatus. The method involves providing a deposition substrate to a substrate support region of a deposition chamber having a dual seal configuration as described herein. An outer circumferential seal defining a volume encompassing the substrate support region and fluidly connected with an evacuation apparatus is formed. An inner circumferential seal that seals the substrate support region from the evacuation apparatus to form a deposition microvolume is also made. A chemical deposition is conducted in the microvolume. The inner seal is then opened and the microvolume evacuated. The outer seal is then opened and the substrate is removed from the substrate support region, for example by indexing of wafers in a multiple deposition station system (MDSS).

In specific embodiments of the apparatus and process, such as described with reference to FIGS. 4A-C, 5 and 6 above, the seals are a pair of concentric circumferential elastomeric seals borne by the pedestal module that are actuated by pressing the pedestal against the showerhead, by movement of either or both of those modules. In alternative embodiments, one or both seals can also be borne by the showerhead module. In operation of the apparatus, the engagement or disengagement of the modules by this movement sequences the seals to provide the desired process conditions.

Figure 9:
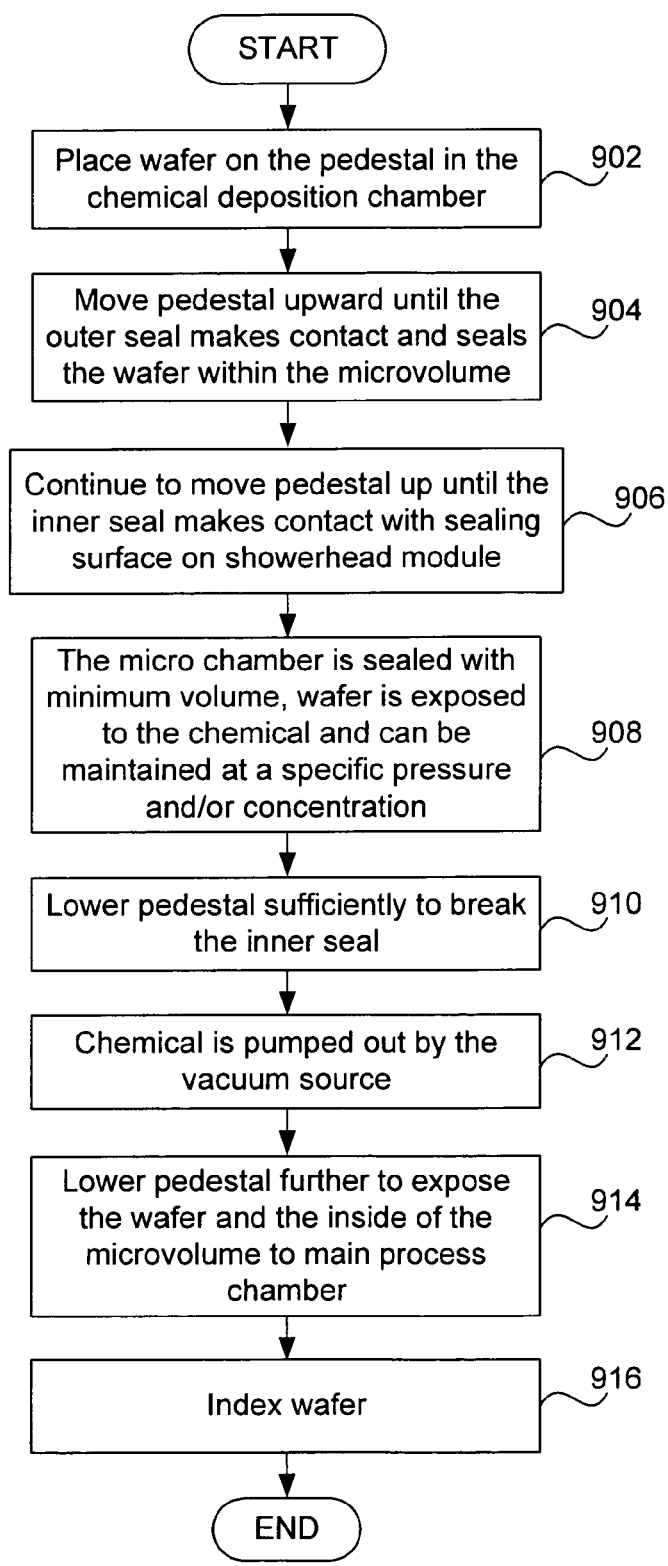
FIG. 9 provides a process flow depicting steps in an example of a sealing and unsealing operation according to the present invention, consistent with the embodiment illustrated in FIGS. 4A-C.

An example of a sealing and unsealing operation according to this embodiment, consistent with FIGS. 4A-C, is illustrated in the process flow 900 of FIG. 9. A wafer (substrate) is placed on a pedestal in a chemical deposition chamber (902). The pedestal moves upward until the outer seal makes contact and seals the wafer within the microvolume (904). At this position the microvolume is open to the vacuum source and can be purged and or pumped to remove any unwanted material. The pedestal then continues to move up until the inner seal makes contact with a sealing surface on the showerhead module (providing additional compression on the outer seal) (906). At this position the micro chamber is sealed with minimum volume and dead legs as the actual sealing point is just beyond the edge of the wafer. The wafer is then exposed to the chemical (dose) and can be maintained at a specific pressure, total dose amount and/or concentration without the need to constantly flow chemical ("stop flow" or "stopped flow") (908). The pedestal is then lowered sufficiently to break the inner seal only (the outer seal is maintained) (910), and the chemical is pumped out by the vacuum source (912). Additionally purge gas can be used to help sweep any remaining chemical out of the microvolume. The pedestal is then lowered further, exposing the wafer and the inside of the microvolume to the main process chamber (914). The wafer is then indexed in typical MSSD fashion (916).

Unsealing and Evacuation Methods

Figure 10:
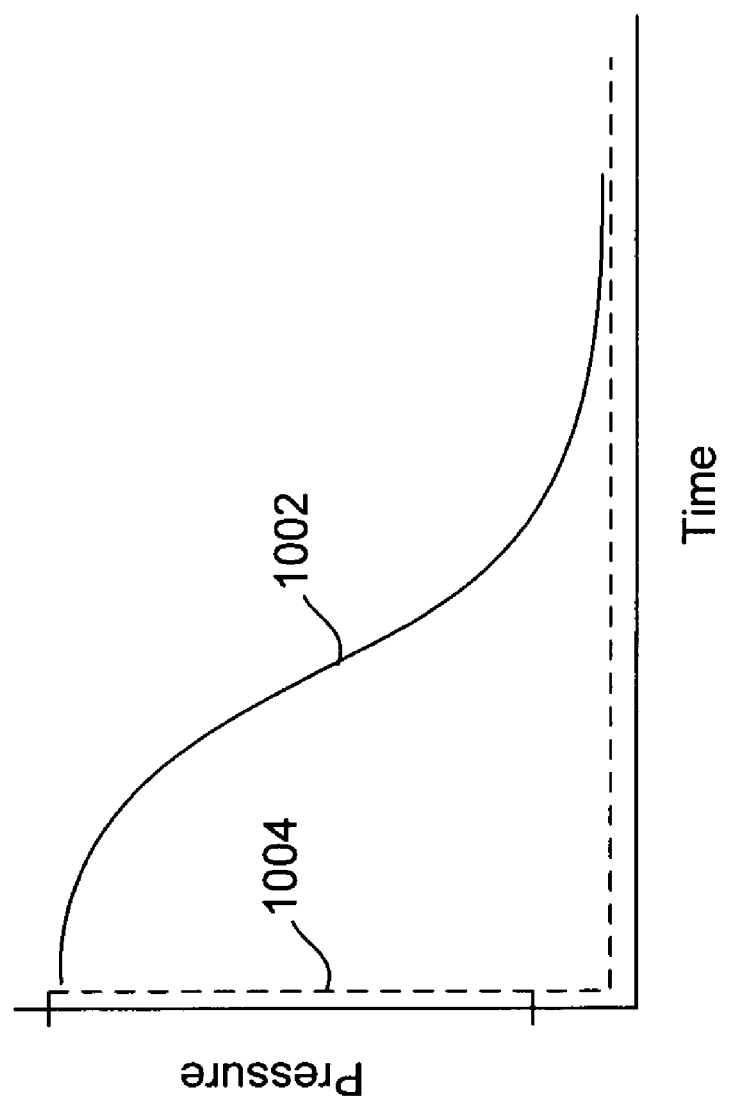
FIG. 10 depicts a plot of pressure vs. time illustrating a representative smooth gradient profile of the gradual pressure release resulting from operation in accordance with the present invention, that avoids wafer floating and backstreaming.

Some embodiments of the invention also provide improved control of post-deposition microvolume evacuation in multistation deposition reactors in which microvolumes share a common foreline. Evacuation is conducted in such a way that the substrate (e.g., wafer) is not floated and backstreaming from one station to another is avoided. This evacuation control can be accomplished in various ways. In all cases, the resulting gradual pressure release has a smooth gradient profile, as illustrated in FIG. 10, that avoids wafer floating and backstreaming.

Figure 11A:
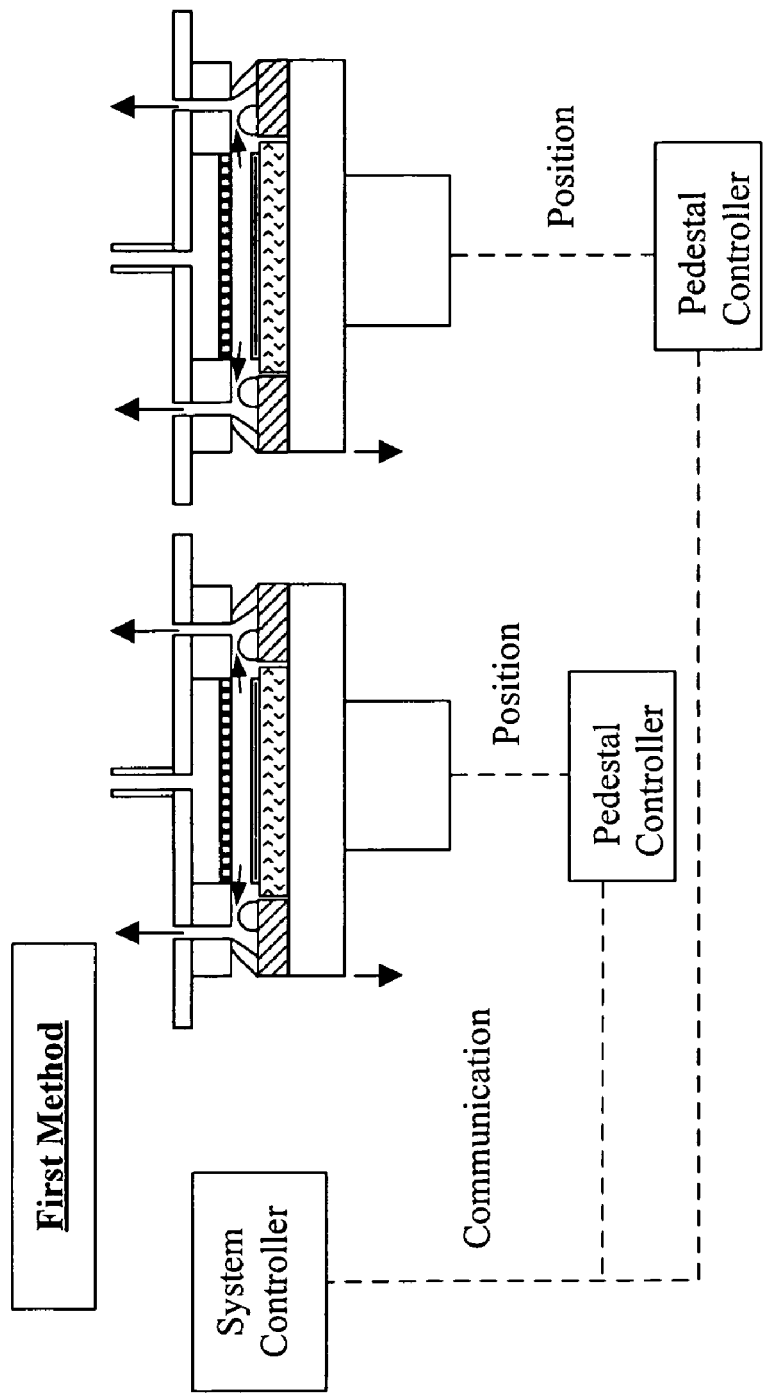
FIGS. 11A-C illustrate sample unsealing methods in accordance with the present invention.

According to a first unsealing method, illustrated in FIG. 11A, the microvolume opening ("unseal") rate is controlled to be gradual for each station so that a sharp pressure drop is avoided and the foreline is not overloaded with evacuated gas beyond the capacity of the pump to remove it before it reaches another station with the shared foreline. In an apparatus configuration where the microvolume is opened and closed by movement of the pedestal, slow pedestal speeds can be used to prevent sudden pressure changes during microvolume evacuation. This is a passive method that does not involve any feedback, but relies simply on gradual rather than sudden opening of the microvolume to produce a gradual pressure release that is insufficient to cause wafer float or backstreaming. It has the advantage of simplicity.

Figure 11B:
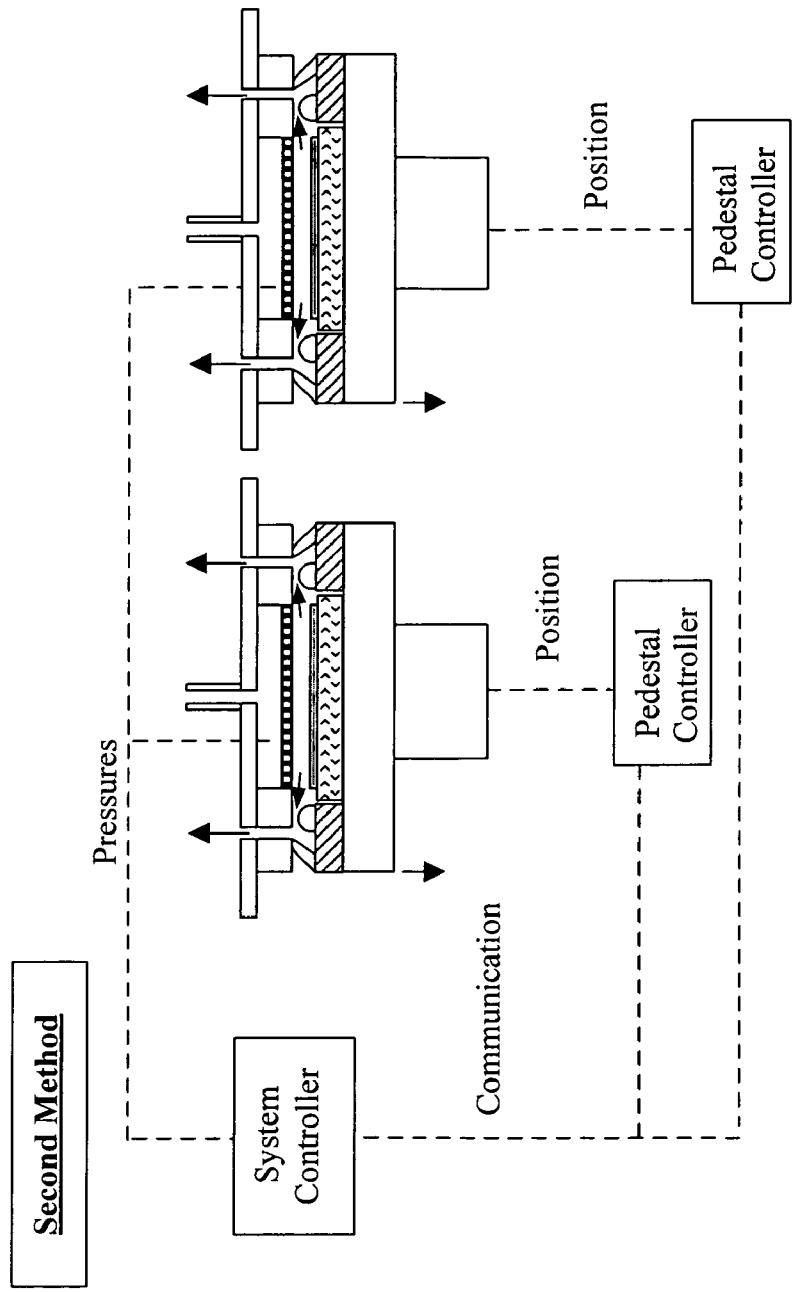

In a second unsealing method, illustrated in FIG. 11B, the evacuation rate is controlled by reactor-based software controls which open each microvolume at an incremental rate while monitoring the pressure change in each microvolume. This method utilizes closed-loop control by the reactor system controller and moves each pedestal in small increments as determined by the pressure in each microvolume. This method adds a level of complexity beyond the first method, but the feedback provided by the pressure monitoring allows for improved microvolume evacuation pressure rate control and a greater rate of opening while still avoiding wafer floating and backstreaming.

Figure 11C:
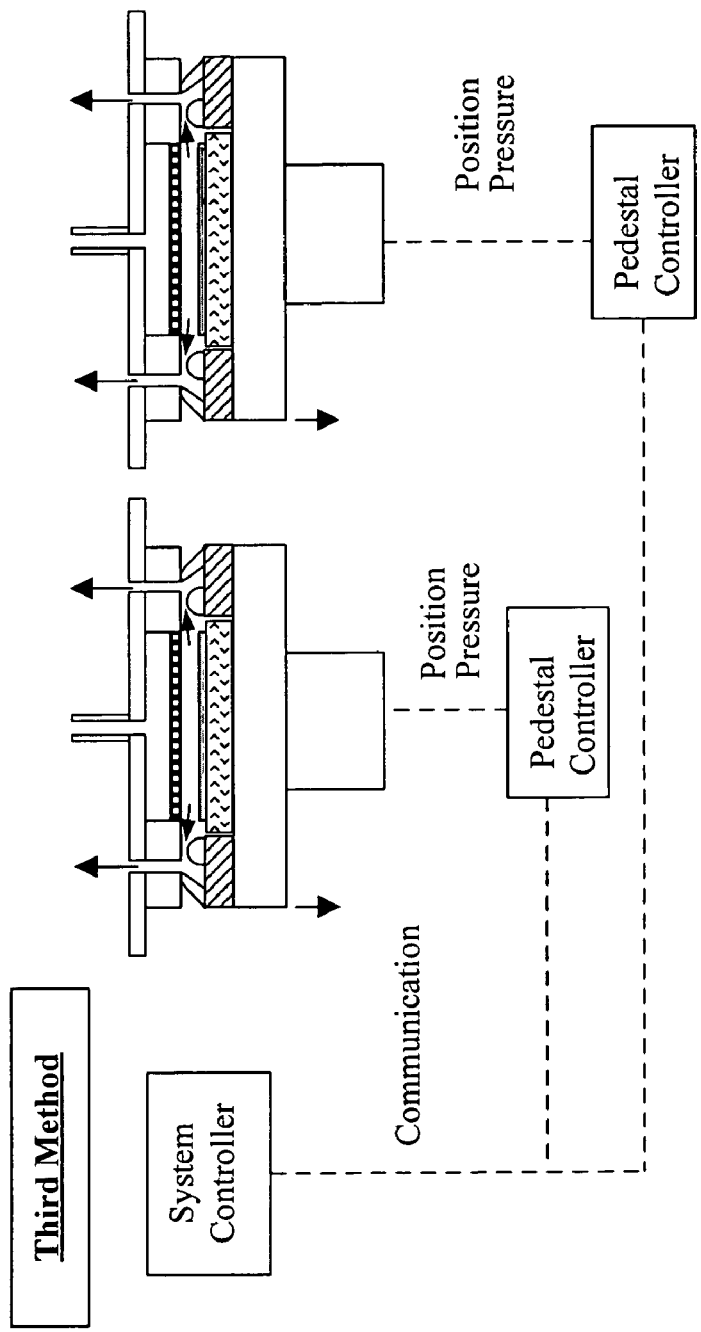

In a third unsealing method, illustrated in FIG. 11C, each microvolume pressure reading is wired to the microvolume pedestal controllers for more precise control of evacuation rates during the unsealing movement. This third option utilizes closed-loop control by the pedestal controller(s) with pressure feedback from the microvolumes. This method utilizes the controller processing power to control the microvolume evacuation pressure rate more precisely than the second method. This allows for an optimal and tightly controlled evacuation rate and minimized backstreaming effects. Additionally, the speed of the unseal is faster than that of either the first or second methods, increasing throughput.

CONCLUSION

Although the foregoing invention has been described in some detail for purposes of clarity of understanding, it will be apparent that certain changes and modifications may be practiced within the scope of the invention. It should be noted that there are many alternative ways of implementing both the process and apparatus of the present invention. For example, while the invention has been described primarily in the context of semiconductor fabrication, it is not so limited. Accordingly, the present embodiments are to be considered as illustrative and not restrictive, and the invention is not to be limited to the details given herein, but may be modified to encompass equivalents.

All documents cited herein are hereby incorporated by reference in their entirety and for all purposes.

What is claimed:

1. A chemical deposition process chamber apparatus, comprising:
   a substrate pedestal module comprising substrate support region;
   a showerhead module comprising process fluid injection outlets;
   one or more seal members comprised by either or both of the substrate pedestal module or the showerhead module, the one or more seal members operable to engage either or both of the modules to provide a plurality of circumferential seals comprising a dual seal including an outer seal defining a greater volume and an inner seal defining a lesser volume within the greater volume, the lesser volume encompassing the substrate support region and exposed to the showerhead module process fluid injection outlets; and
   evacuation apparatus fluidly connected with the greater volume and not the lesser volume.

2. The apparatus of claim 1, wherein the one or more seal members comprise a pair of concentric elastomeric seals.

3. The apparatus of claim 2, wherein the pair of concentric elastomeric seals are an inner O-ring, operable to form the seal defining the lesser volume, circumscribed by an outer lip seal, operable to form the seal defining the greater volume.

4. The apparatus of claim 3, wherein the pair of concentric elastomeric seals are comprised by the pedestal module.

5. The apparatus of claim 4, wherein at least the inner O-ring seal is comprised of a material that retains its elastomeric properties without substantial particulate generation or chemical outgassing within at least a subset of a temperature range between −100° C. and 300° C., upon exposure to chemicals used in the deposition process, and with mechanical cycling.

6. The apparatus of claim 4, wherein at least the inner O-ring seal is comprised of a perfluoroelastomer.

7. The apparatus of claim 6, wherein the elastomer comprises a particulate filler.

8. The apparatus of claim 7, wherein the filler is nanoparticulate.

9. The apparatus of claim 3, wherein either or both of the pair of concentric elastomeric seals are engaged with one of the modules in a channel circumferential to the substrate support region and operable to engage with the other of the modules by contact to form the plurality of circumferential seals.

10. The apparatus of claim 9, wherein the channel for the outer lip seal comprises a re-entrant feature on its outer sidewall.

11. The apparatus of claim 1, wherein the one or more seal members comprise a concentric elastomeric seal and a plurality of discrete vacuum channels and valves disposed concentrically about the elastomeric seal.

12. The apparatus of claim 11, wherein the concentric elastomeric seal is operable to form the seal defining the lesser volume and is circumscribed by the plurality of discrete valves disposed concentrically about the elastomeric seal and operable to form the seal defining the greater volume.

13. The apparatus of claim 1, wherein the one or more seal members comprises a single elastomeric seal member mounted on a flexible element operable to engage each of the modules with a separate contact area to provide the plurality of circumferential seals defining the greater volume and the lesser volume within the greater volume encompassing the substrate support region.

14. The apparatus of claim 13, wherein the flexible element comprises a metal.

15. A multi-station chemical deposition process apparatus comprising, at one or more stations, an apparatus in accordance with claim 1.

16. The apparatus of claim 15, further comprising, at one or more other stations, a chemical deposition process chamber apparatus having a single seal.

17. A method of conducting a chemical deposition process, comprising:
   providing a deposition substrate to a substrate support region of a deposition chamber comprising the apparatus of claim 1;
   forming an outer circumferential seal defining the greater volume encompassing the substrate support region and fluidly connected with the evacuation apparatus;
   forming an inner circumferential seal defining the lesser volume encompassing the substrate support region and sealed from the evacuation apparatus; and
   conducting the chemical deposition in the lesser volume.

18. The method of claim 17, further comprising evacuating the greater volume prior to forming the inner circumferential seal.

19. The method of claim 17, further comprising, after conducting the chemical deposition:
   opening the inner seal;
   evacuating the lesser volume; and
   opening the outer seal.

20. The method of claim 19, further comprising, after opening the outer seal, removing the substrate from the substrate support region.

21. The method of claim 17, wherein the chemical deposition comprises one step in a multi-step pulsed deposition layer dielectric deposition process.

22. The method of claim 21, wherein the pulsed deposition layer dielectric deposition process comprises:
   (i) exposing the substrate surface to a catalyst or catalyst-containing precursor gas to form a catalyst on the substrate surface; and
   (ii) exposing the substrate surface to a silicon-containing precursor gas to form a silicon oxide-based dielectric film layer on the substrate.

23. The method of claim 22, wherein the catalyst or catalyst-containing precursor is a metal catalyst-containing precursor is selected from the list of metal catalyst-containing precursors comprising aluminum, zirconium, hafnium, gallium, titanium, niobium, tantalum, and combinations thereof.

24. The method of claim 23, wherein the metal catalyst-containing precursor is at least one of hexakis(dimethylamino) aluminum and trimethyl aluminum.

25. The method of claim 22, wherein the catalyst or catalyst-containing precursor is a metal- and metalloid-free catalyst that can sufficiently adsorb onto or react with the substrate surface and prepare it to react with the subsequently added silicon-containing precursor to form a dielectric layer more than a monolayer thick.

26. The method of claim 25, wherein the catalyst is selected from the group consisting of organic acids, anhydrides of organic acids, dialkylphosphates, alkysphosphates, phosphonic acids, phosphinic acids, phosphorus oxides, alkylamines (primary, secondary or tertiary), arylamines, alky/arylboronic acids, sulphonic acids, water, ammonium salts, phosphonitrile compounds, boron triflates, inorganic acids, anhydrides of inorganic acids, and combinations thereof.

27. The method of claim 22, wherein the silicon-containing precursor is at least one of a silanol and a silanediol.

28. The method of claim 27, wherein the substrate is a semiconductor wafer.

29. The method of claim 22, wherein the pulsed deposition layer dielectric deposition process is conducted in a multi-station deposition apparatus.

30. The method of claim 29, wherein (a) is conducted at one station of the multi-station deposition apparatus and (b) is conducted at another station of the multi-station deposition apparatus, and at least one of the stations comprises
- a chemical deposition process chamber apparatus, comprising:
- a substrate pedestal module comprising substrate support region;
- a showerhead module comprising process fluid injection outlets;
- one or more seal members comprised by either or both of the substrate pedestal module or the showerhead module, the one or more seal members operable to engage either or both of the modules to provide a plurality of circumferential seals comprising a dual seal including an outer seal defining a greater volume and an inner seal defining a lesser volume within the greater volume, the lesser volume encompassing the substrate support region and exposed to the showerhead module process fluid injection outlets; and
- evacuation apparatus fluidly connected with the greater volume and not the lesser volume.

31. The method of claim 19, wherein the inner seal is opened gradually.

32. The method of claim 31, wherein the gradual opening is such that the pressure release does not cause the substrate to float.

33. The method of claim 32, wherein a plurality of deposition chambers comprising a chemical deposition process chamber apparatus comprising:
- a substrate pedestal module comprising substrate support region;
- a showerhead module comprising process fluid injection outlets;
- one or more seal members comprised by either or both of the substrate pedestal module or the showerhead module, the one or more seal members operable to engage either or both of the modules to provide a plurality of circumferential seals comprising a dual seal including an outer seal defining a greater volume and an inner seal defining a lesser volume within the greater volume, the lesser volume encompassing the substrate support region and exposed to the showerhead module process fluid injection outlets; and
- evacuation apparatus fluidly connected with the greater volume and not the lesser volume;

are combined in a multi-station deposition reactor, the plurality of deposition chambers share a common vacuum foreline for the evacuation apparatus, and the gradual opening of the inner seal is such that the pressure release does not cause backstreaming of the gas flow from one chamber to another.

* * * * *